(12) United States Patent
Campbell et al.

(10) Patent No.: US 10,082,048 B2
(45) Date of Patent: *Sep. 25, 2018

(54) FUEL VAPORIZATION USING DATA CENTER WASTE HEAT

(71) Applicant: INTERNATIONAL BUSINESS MACHINES CORPORATION, Armonk, NY (US)

(72) Inventors: Levi A. Campbell, Poughkeepsie, NY (US); Milnes P. David, Fishkill, NY (US); Dustin W. Demetriou, Poughkeepsie, NY (US); Roger R. Schmidt, Poughkeepsie, NY (US); Robert E. Simons, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 201 days.

This patent is subject to a terminal disclaimer.

(21) Appl. No.: 15/249,718

(22) Filed: Aug. 29, 2016

(65) Prior Publication Data

US 2016/0363353 A1 Dec. 15, 2016

Related U.S. Application Data

(63) Continuation of application No. 14/829,869, filed on Aug. 19, 2015, now Pat. No. 9,546,576, which is a (Continued)

(51) Int. Cl.
*F25B 27/02* (2006.01)
*F01K 25/08* (2006.01)
(Continued)

(52) U.S. Cl.
CPC ............... *F01K 25/08* (2013.01); *F01K 5/00* (2013.01); *F25B 15/00* (2013.01); *F25B 19/00* (2013.01);
(Continued)

(58) Field of Classification Search
CPC ............... F01K 25/08; F01K 5/00; H02P 9/04
See application file for complete search history.

(56) References Cited

U.S. PATENT DOCUMENTS 7,081,684 B2 7/2006 Patel et al.
8,522,569 B2 9/2013 Avery et al.
(Continued)

FOREIGN PATENT DOCUMENTS

CA 2 824 112 A1 2/2014
WO 2013/130557 A1 9/2013

OTHER PUBLICATIONS

Campbell et al., Notice of Allowance for U.S. Appl. No. 14/547,284, filed Nov. 19, 2014 (U.S. Patent Publication No. 2016/0141937 A1), dated Aug. 5, 2016 (17 pages).
(Continued)

*Primary Examiner* — Viet Nguyen
(74) *Attorney, Agent, or Firm* — Tihon Poltavets, Esq.; Kevin P. Radigan, Esq.; Heslin Rothenberg Farley & Mesiti P.C.

(57) ABSTRACT

Systems and methods are provided for data center cooling by vaporizing fuel using data center waste heat. The systems include, for instance, an electricity-generating assembly, a liquid fuel storage, and a heat transfer system. The electricity-generating assembly generates electricity from a fuel vapor for supply to the data center. The liquid fuel storage is coupled to supply the fuel vapor, and the heat transfer system is associated with the data center and the liquid fuel storage. In an operational mode, the heat transfer system
(Continued)

transfers the data center waste heat to the liquid fuel storage to facilitate vaporization of liquid fuel to produce the fuel vapor for supply to the electricity-generating assembly. The system may be implemented with the liquid fuel storage and heat transfer system being the primary fuel vapor source, or a back-up fuel vapor source.

9 Claims, 9 Drawing Sheets

Related U.S. Application Data continuation of application No. 14/547,284, filed on Nov. 19, 2014, now Pat. No. 9,546,575.

(51) Int. Cl.
  *H02P 9/04*   (2006.01)
  *H05K 7/20*   (2006.01)
  *F25B 15/00*   (2006.01)
  *F25B 19/00*   (2006.01)
  *F25B 49/00*   (2006.01)
  *F01K 5/00*   (2006.01)

(52) U.S. Cl.
  CPC ............ *F25B 27/02* (2013.01); *F25B 49/00* (2013.01); *H02P 9/04* (2013.01); *H05K 7/20709* (2013.01); *H05K 7/20818* (2013.01); *H05K 7/20836* (2013.01)

(56) References Cited

U.S. PATENT DOCUMENTS

| | | | |
|---|---|---|---|
| 8,739,540 B2 | 6/2014 | McCutchen et al. | |
| 9,546,575 B2* | 1/2017 | Campbell | F25B 15/00 |
| 9,546,576 B2* | 1/2017 | Campbell | F25B 15/00 |
| 2005/0073150 A1 | 4/2005 | Patel et al. | |
| 2010/0024445 A1 | 2/2010 | Cichanowicz | |
| 2011/0096503 A1* | 4/2011 | Avery | F25B 27/02 361/701 |
| 2011/0227344 A1* | 9/2011 | Hatton | H02J 3/38 290/52 |
| 2012/0175088 A1 | 7/2012 | Su et al. | |
| 2012/0232879 A1 | 9/2012 | Iyengar et al. | |
| 2012/0286514 A1 | 11/2012 | Graybill et al. | |
| 2013/0273445 A1 | 10/2013 | Kobayashi et al. | |
| 2013/0312435 A1 | 11/2013 | Khalifa | |
| 2013/0328395 A1* | 12/2013 | Krizman | H02J 4/00 307/18 |
| 2014/0048235 A1 | 2/2014 | Kamaludeen et al. | |
| 2014/0217739 A1* | 8/2014 | Morgan | F01D 15/10 290/54 |
| 2015/0268682 A1 | 9/2015 | Hyde et al. | |
| 2015/0337691 A1* | 11/2015 | Somani | F01K 15/00 60/645 |
| 2016/0004263 A1* | 1/2016 | James | F24F 11/0001 236/94 |
| 2016/0141937 A1 | 5/2016 | Campbell et al. | |
| 2016/0143190 A1 | 5/2016 | Campbell et al. | |
| 2016/0363352 A1* | 12/2016 | Campbell | F25B 15/00 |

OTHER PUBLICATIONS

Campbell et al., Notice of Allowance for U.S. Appl. No. 14/829,869, filed Aug. 19, 2015 (U.S. Patent Publication No. 2016/0143190 A1), dated Aug. 19, 2016 (16 pages).
Campbell et al., "Fuel Vaporization Using Data Center Waste Heat", U.S. Appl. No. 15/249,703, filed Aug. 29, 2016 (36 pages).
Campbell et al., "List of IBM Patents and Patent Applications Treated as Related" for U.S. Appl. No. 15/249,718, dated Aug. 29, 2016 (2 pages).

* cited by examiner

FUEL VAPORIZATION USING DATA CENTER WASTE HEAT

BACKGROUND

For high-density data computing, telecommunications and storage needs, computer system equipment is typically installed in open or closed equipment racks, or electronics racks, located in data centers, also known as "server farms", where the facility environment can be controlled to maintain a proper operating temperature, relative humidity range, and particulate cleanliness.

Data centers often consume a large amount of electricity and generate significant waste heat. The generated waste heat must be dissipated from the data center in order to meet operational requirements of the electronic components within the data center. Typically, electronic components are maintained in a safe operating temperature range by circulating cooled air through the equipment to cool the electronics racks, or for instance, by more directly cooling selected electronic components with a heat transfer fluid, or by a combination thereof. The American Society of Heating, Refrigeration, and Air-Cooling Engineers (ASHRAE) develops and publishes data center cooling standards which provide industry consensus best practices for data center cooling.

One approach to cooling the air or heat transfer fluid used to cool a data center, or more particularly, the equipment within the data center, is by means of a refrigeration chiller to chill air, water, or other heat transfer fluid, which is then used to cool the data center equipment. Other methods of cooling have been tried, each with its own advantages and disadvantages.

Operational reliability is of utmost importance in the operation of a data center. Data center outages are expensive, and an extended outage can be devastating to a data center operator, both in terms of expense and business reputation. Thus, redundant units and/or back-up units, such as back-up power supplies, data communication connections, and environment control and security apparatuses are also typically provided as part of the data center, or facility management system associated with the data center.

In the realm of data center cooling and powering, commercial advantage would be obtained by providing systems to cool and power a data center which are effective in all climates, environmentally beneficial, and/or more energy efficient than existing approaches.

BRIEF SUMMARY

In one aspect, shortcomings of the prior art are overcome, and additional advantages are provided, through the provision of a method which includes: providing an electricity-generating assembly to generate electricity from a fuel vapor for supply to a data center, the data center producing data center waste heat; providing a liquid fuel storage to facilitate supply of the fuel vapor to the electricity-generating assembly; and providing a heat transfer system associated with the data center and the liquid fuel storage, wherein in an operational mode, the heat transfer system transfers the data center waste heat to the liquid fuel storage to facilitate vaporization of liquid fuel to produce the fuel vapor for supply to the electricity-generating assembly.

In another aspect, a method is provided which includes: providing a heat transfer system coupling a data center and a liquid fuel storage, the data center producing data center waste heat, and the liquid fuel storage being coupled to facilitate supply of a fuel vapor to an electricity-generating assembly, the electricity-generating assembly generating electricity from the fuel vapor for supply to the data center, wherein in an operational mode, the heat transfer system transfers the data center waste heat to the liquid fuel storage to facilitate vaporization of liquid fuel to produce the fuel vapor for supply to the electricity-generating assembly.

Additional features and advantages are realized through the structures and methods of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

As used herein, the terms "electronics rack" and "equipment rack" are used interchangeably, and unless otherwise specified include any open or closed housing, frame, rack, compartment, blade server system, etc., having one or more heat generating components of a computer system or electronic system, and may be, for example, a stand-alone computer processor having high, mid or low end processing capability. In one embodiment, an electronics rack may include one or more electronic systems or subsystems, each having one or more heat generating components requiring cooling.

"Heat exchanger" includes any heat exchange mechanism characterized as described herein through which a coolant or heat transfer fluid can circulate; and may include, one or more discrete heat exchangers coupled either in series or in parallel. A heat exchanger may include, for example, one or more fluid flow paths, formed of thermally conductive tubing (such as copper or other tubing) in thermal communication with a plurality of heat transfer fins. Size, configuration and construction of the heat exchanger can vary without departing from the scope of the invention disclosed herein. "Heat exchanger" may be used herein to refer to various types of heat exchangers, such as an air-to-liquid heat exchanger or a liquid-to-liquid heat exchanger. Further, "data center" refers to a computer installation containing one or more electronic systems, electronics racks, etc., to be cooled. As a specific example, a data center may include one or more rows of rack-mounted computing units, such as server units.

One example of the heat transfer fluid employed is a liquid, such as water. However, the concepts disclosed herein are readily adapted to use with other types of fluid. For example, one or more of the fluids may comprise a brine, a fluorocarbon liquid, a liquid metal, or other similar coolant, or refrigerant, while still maintaining the advantages and unique features of the present invention.

Reference is made below to the drawings, where the same or similar reference numbers used throughout different figures designate the same or similar components.

Figure 1A:
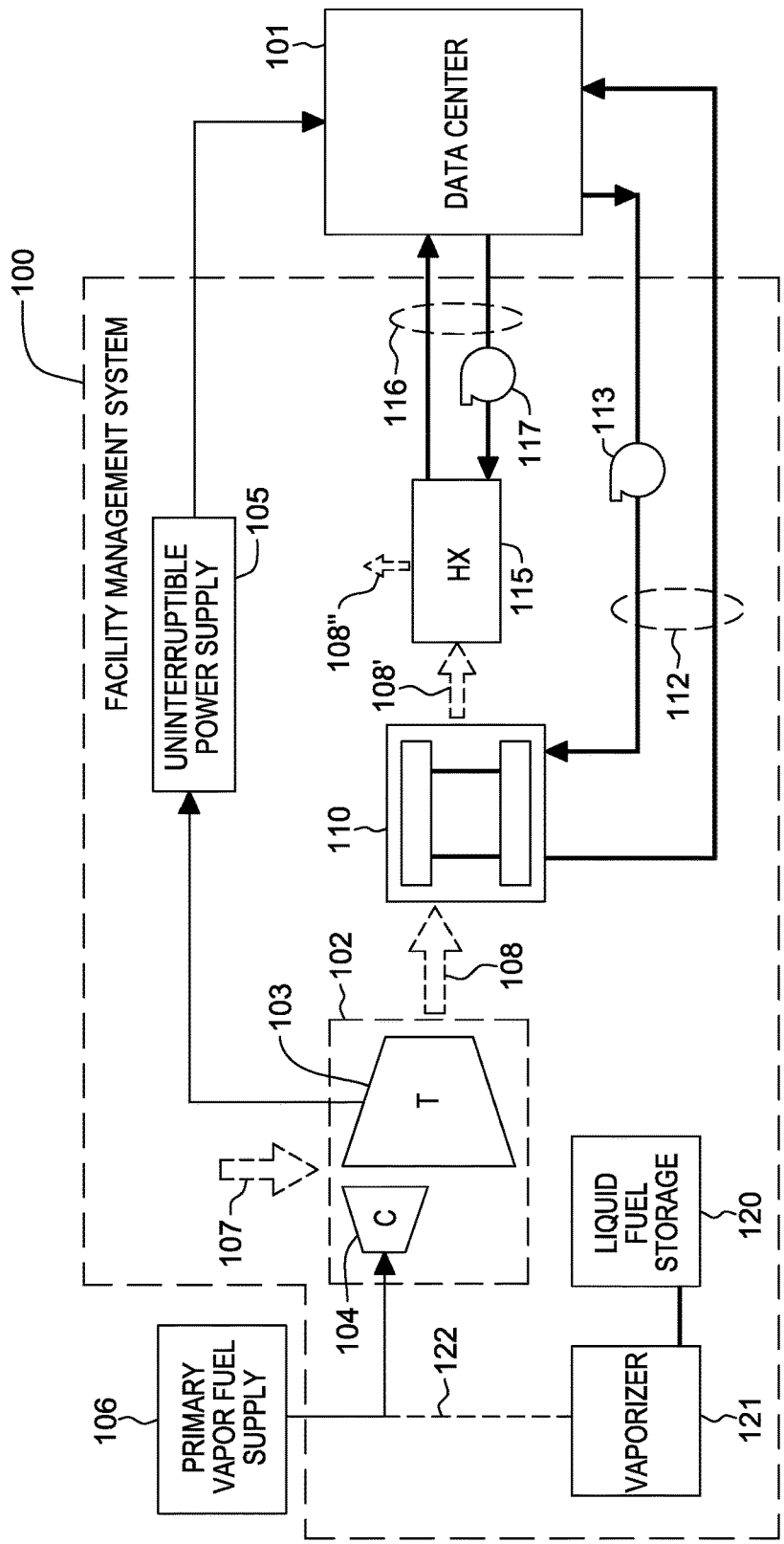
FIG. 1A depicts one embodiment of an on-site, tri-generation system for powering, heating and cooling a data center, which may be modified in accordance with one or more aspects of the present invention.

FIG. 1A illustrates one embodiment of an on-site, trigeneration system for powering, heating, and cooling a data center, which may be modified in accordance with one or more aspects of the present invention. As illustrated in FIG. 1A, the system includes a facility management system 100 associated with a data center 101, which houses, for instance, computing functions such as critical IT functions, that require a high level of reliability, as well as uninterruptable power and cooling. An electricity-generating assembly 102 generates, in certain embodiments, on-site power which may be used to power the data center, for instance, to meet electrical requirements of the data center. In the depicted example, electricity-generating assembly 102 includes, by way of example only, a turbine (T) 103 and a compressor (C) 104, which are coupled to a primary vapor fuel supply 106 for receiving primary fuel vapor, and converting the primary fuel vapor into electricity. In the illustrated example, generated electricity is supplied via an uninterruptible power supply 105 to data center 101. Alternatively, generated electricity could be supplied directly to data center 101.

A benefit of on-site power generation is the ability to re-use generating assembly waste heat 108 for providing cooling and/or heating to data center 101, or adjacent facilities, if desired. In operation, an airflow 107 may be drawn into electricity-generating assembly 102, and heated during the electricity-generating process to produce an exhaust airflow comprising generating assembly waste heat 108. Note that electricity-generating assembly 102 may comprise any of a variety of prime movers, such as a micro-turbine, a turbine, a gas generator, a fuel cell, etc., and compressor 104 may be optionally provided, depending on the pressure with which the fuel vapor is provided to electricity-generating assembly 102, and the type of assembly used within the system.

Under normal operating conditions, electricity-generating assembly 102 is operated using fuel vapor from primary vapor fuel supply 106, such as a natural gas supply. The primary fuel vapor could be supplied by a pipe to the facility from a remote location, with the primary fuel vapor being employed by electricity-generating assembly 102 to provide (as noted) electricity to the data center, as well as charge and maintain charge on uninterruptible power supply 105, or other back-up battery supply.

Note that in the example of FIG. 1A, a back-up liquid fuel storage 120, such as an on-site liquid fuel storage, may be provided selectively coupled in fluid communication 122 with electricity-generating assembly 102 via a vaporizer 121, such as a direct-fired vaporizer. In operation, vaporizer 121 draws liquid fuel from liquid fuel storage 120, and vaporizes the liquid fuel for supply of back-up fuel vapor to electricity-generating assembly 102, for instance, when primary vapor fuel supply 106 is interrupted. As noted, vaporizer 121 might comprise a direct-fired vaporizer, which burns a portion of the stored liquid fuel to vaporize the liquid fuel required by electricity-generating assembly 102, with the direct-fired vaporizer being ignited using a pilot light, for example. This process necessarily reduces the liquid fuel available for providing emergency operation of the data center functions. An alternative vaporizer would be a hot water or steam-fired system, the provision of which would add additional cost and complexity to the facility management system 100 for data center 101.

Generating assembly waste heat 108 may be used to cool data center 101 via an absorption chiller (or absorption refrigeration system) 110. As illustrated, a facility coolant loop 112 and one or more pumps 113, facilitate circulating a facility coolant between data center 101 and absorption chiller 110, with extracted data center waste heat being dissipated by the absorption chiller (driven by the generating assembly waste heat). Further, unused generating assembly waste heat 108' may be provided to a heat exchanger 115, such as an exhaust-fired heat exchanger, which may further extract heat from the remaining generating assembly waste heat 108' to, for instance, provide selected heating to the data center, or the facility housing the data center. In one implementation, heat exchanger 115 could be used to heat water for supply of hot water to the data center via, for instance, a hot water loop 116, through which water is pumped 117 between heat exchanger 115 and data center 101. As illustrated, any still-remaining generating assembly waste heat 108" may be rejected to the ambient environment. Note that although facility management system 100 is illustrated as external to data center 101, one or more features of facility management system 100 could be incorporated within data center 101, depending on the implementation.

As noted, within the data center, cooling may be provided via one or more computer room air-conditioning units (CRACs), liquid-cooling systems, etc., exemplary embodiments of which are described below with reference to FIGS. 1B & 1C.

Figure 1B:
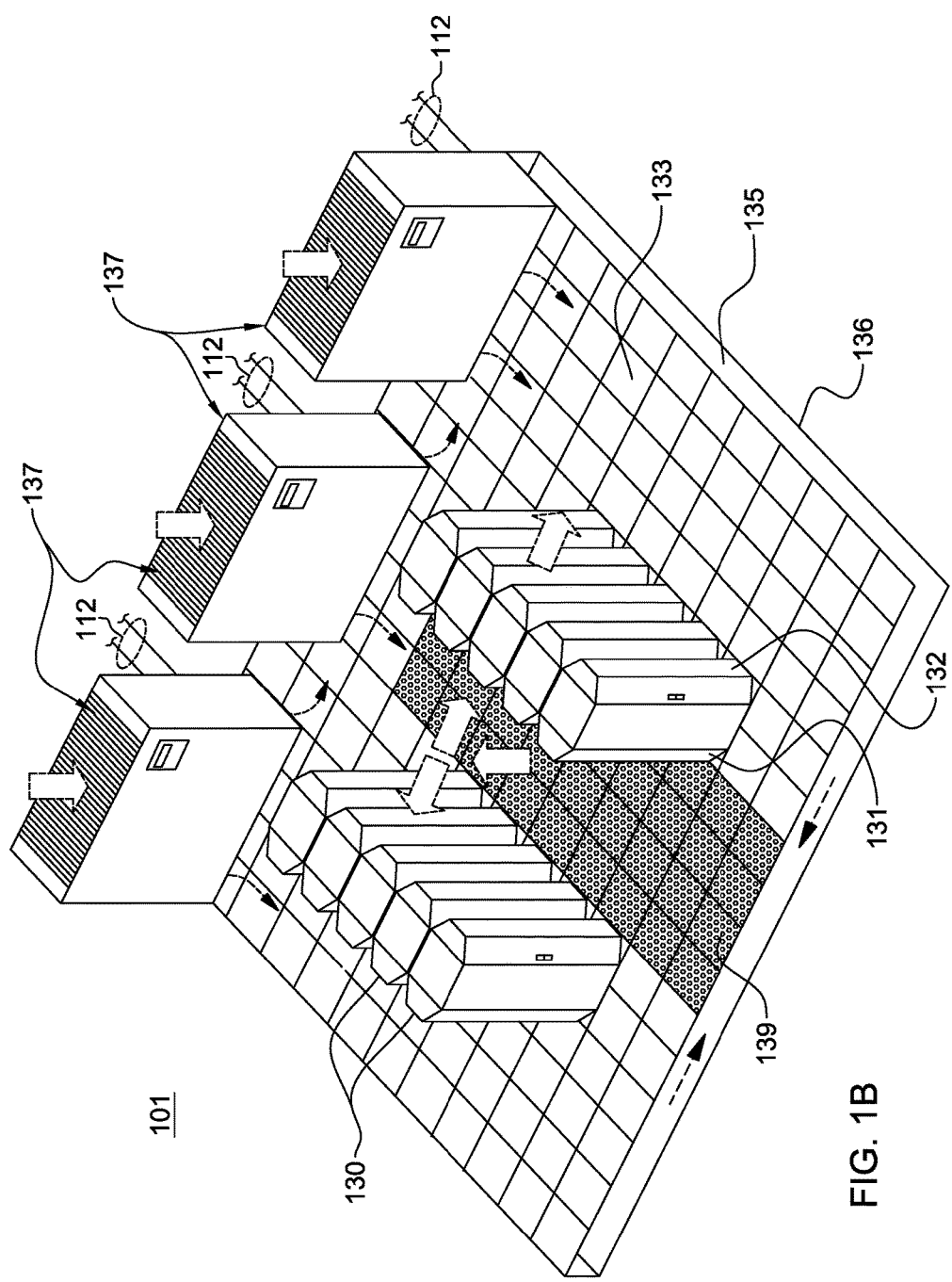
FIG. 1B depicts one embodiment of a data center with a plurality of electronics racks, and multiple computer-room air-conditioner (CRACs) units to extract data center waste heat, which may be used to facilitate on-site power generation, in accordance with one or more aspects of the present invention.

FIG. 1B depicts one embodiment of a raised floor, data center 101 layout. In this layout, multiple electronics racks 130 are disposed in one or more rows. A computer installation such as depicted in FIG. 1B may house several hundred, or even several thousand, processors. In the arrangement of FIG. 1B, cooled air enters the computer-room via perforated floor tiles 139 from a supply air plenum 135 defined between the raised floor 133 and a base or sub-floor 136 of the room. Cooled air is taken in through louvered air inlet sides 131 of the electronics racks 130 and expelled through louvered air outlet sides 132 of the electronics racks. One or more electronics racks 130 may have one or more an air-moving devices (e.g., axial and/or centrifugal fans) to provide forced inlet-to-outlet airflow to cool the electronic components within the equipment rack. The supply air plenum 135 provides, in one embodiment, cooled air to the air inlet sides of the electronics racks via perforated floor tiles 139 disposed in one or more "cold" aisles of the computer-room installation. The cooled air is supplied to plenum 135 by one or more computer-room air-conditioning units 137, which may also be disposed within data center 101. Room air is taken in through vents and cooled by computer-room air-conditioning units 137 using cooled facility coolant circulating in a facility fluid loop 112. This room air comprises in part exhausted air from the "hot" aisles of the computer-room installation defined, for example, by opposing air outlet sides of electronics racks 130. Taken together, the heat load extracted by the computer-room air-conditioning units 137 and rejected to the facility coolant in the facility fluid loop 112 comprises the data center waste heat, which may be employed as described herein.

Figure 1C:
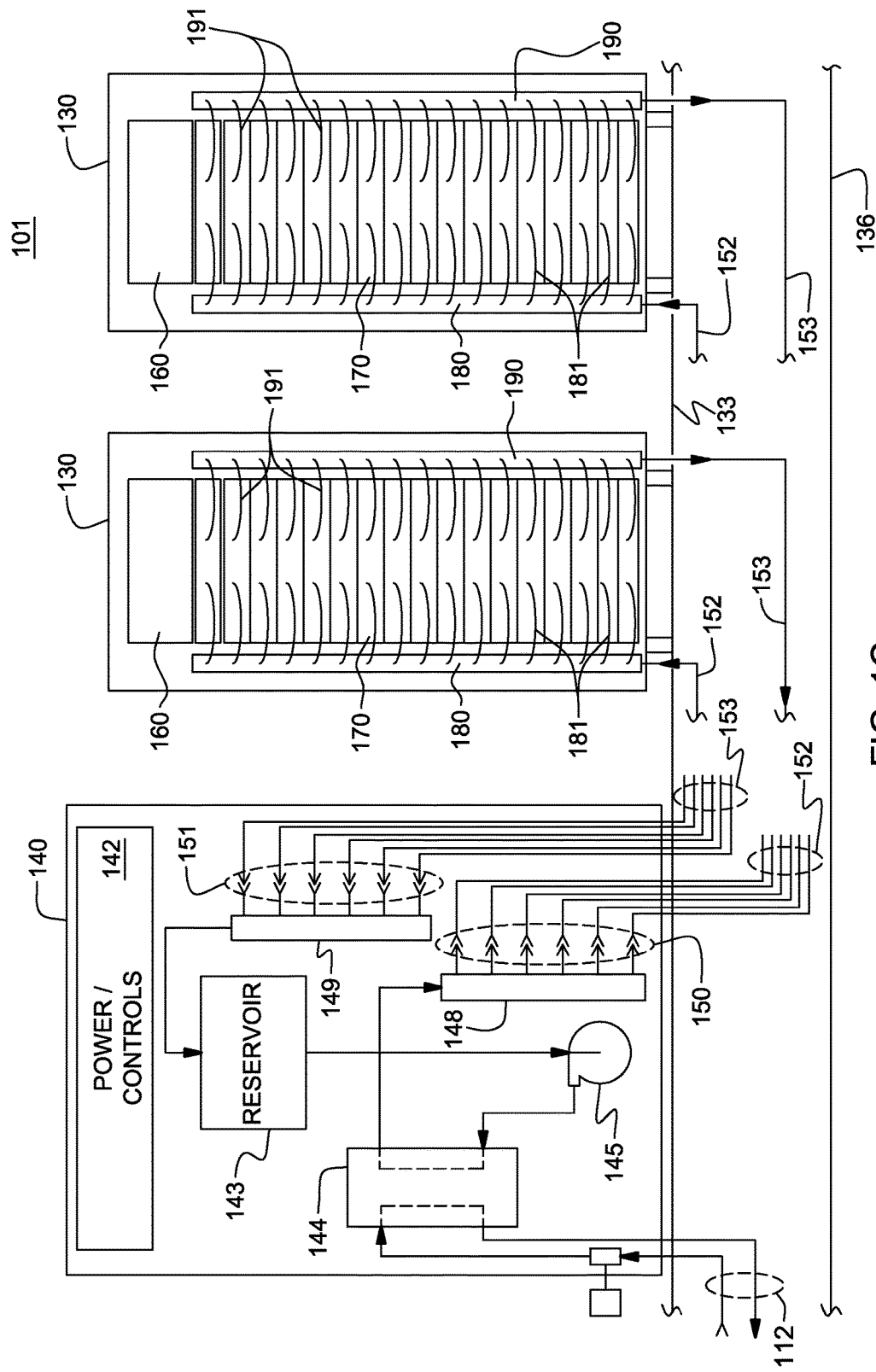
FIG. 1C depicts an alternate embodiment of a data center with multiple electronics racks, and one or more liquid coolant distribution units facilitating liquid extraction of data center waste heat, which may be used to facilitate on-site power generation, in accordance with one or more aspects of the present invention.

FIG. 1C depicts another embodiment of a data center 101 cooling solution, which uses a cooled facility fluid to remove data center waste heat from the data center. In this implementation, one or more coolant distribution units 140 for the data center are employed. As illustrated, coolant distribution unit 140 may include a power/control element 142, a reservoir/expansion tank 143, a liquid-to-liquid heat exchanger 144, a pump 145 (often accompanied by a redundant second pump), a facility coolant loop 112, a supply manifold 148 supplying system coolant to the electronics racks 130 via couplings 150 and lines 152, and a return manifold 149 receiving system coolant from the electronics racks 130, via lines 153 and couplings 151. The electronics racks may include (in one example) a power/control unit 160, multiple electronic systems 170, a system coolant supply manifold 180, and a system coolant return manifold 190. By way of example, electronics racks 130 may be disposed on a raised floor of a data center, with lines 152 providing system coolant to system coolant supply manifolds 180 and lines 153 facilitating return of system coolant from system coolant return manifolds 190 being disposed in the supply air plenum beneath the raised floor 133.

In the embodiment illustrated, system coolant supply manifold 180 provides system coolant to cooling apparatuses disposed within the electronic systems 170 (for example, to coolant-cooled cold plates) via flexible hose connections 181, which are disposed between system coolant supply manifold 180 and the respective electronic systems 170 within the equipment rack. Similarly, system coolant return manifold 190 is coupled to electronic systems 170 via flexible hose connections 191. Quick connect couplings may be employed at the interface between flexible hoses 181, 191 and the individual electronic systems 170. By way of example, these quick connect couplings may comprise various types of commercially available quick connect/disconnect couplings. Although not shown, one or more electronics racks 130 may also include an air-to-coolant heat exchanger, for example, disposed at an air outlet side thereof, which may also receive system coolant from the system coolant supply manifold 180 and return system coolant to the system coolant return manifold 190.

The heat exhausted by the data center cooling solution of FIG. 1C to the facility coolant, either alone or in combination with other cooling approaches, such as the above-described approach of FIG. 1B comprises, in one embodiment, the data center waste heat, which may be used in accordance with the concepts described herein. Note also that the exemplary data center and cooling system configurations of FIGS. 1B & 1C are presented by way of example only. Those skilled in the art will understand that other cooling system approaches could be employed for cooling the data center and extracting the data center waste heat.

Disclosed herein are systems and methods for supplying fuel vapor on-site to an electricity-generating assembly, such as an on-site, co-generation system, or tri-generation system, providing power, cooling, and/or heating, to a data center. The electricity-generating assembly could be, or could include, any of a variety of electricity-generating devices or approaches, such as, for instance, a micro-turbine-based device, a gas generator device, a fuel cell device, etc. Various facility management systems and methods are presented which include heat transfer systems or mechanisms for providing fuel vapor to the electricity-generating assembly, such as the electricity-generating assembly of the noted on-site, co-generation or tri-generation system. Advantageously, data center waste heat may be used to vaporize or assist in vaporizing liquid fuel to provide a required flow rate of fuel vapor to the electricity-generating assembly. Using the data center waste heat as described herein advantageously reduces the burden on the cooling equipment, and provides a cost effective means to both deliver fuel vapor to the electricity-generating assembly, and cool the data center. Further, where desired, the generating assembly waste heat may be combined with the data center waste heat for use in the fuel vapor delivery system(s) described.

Generally stated, a system is provided herein which includes an electricity-generating assembly to generate electricity from a fuel vapor for supply to a data center, the data center producing data center waste heat, and a liquid fuel storage to facilitate supply of the fuel vapor to the electricity-generating assembly. The system further includes a heat transfer system associated with the data center and the liquid fuel storage. In an operational mode, the heat transfer system transfers the data center waste heat to the liquid fuel storage to facilitate vaporization of liquid fuel in the liquid fuel storage to produce the fuel vapor for supply to the electricity-generating assembly. Note that the vaporization may occur within a liquid fuel storage tank itself of the liquid fluid storage, or in an associated structure, such as an associated vaporizer structure or housing of the liquid storage coupled to receive liquid fuel from the liquid fuel storage tank. Any of these various possibilities are encompassed by the phrase "liquid fuel storage". Advantageously, in the operational mode, the heat transfer system provides data center cooling by facilitating dissipation of the data center waste heat during vaporization of liquid fuel at the liquid fuel storage.

In one or more embodiments, the heat transfer system includes a controller, and the electricity-generating assembly produces generating assembly waste heat. The controller is configured (for instance, programmed), to controllably combine the generating assembly waste heat with the data center waste heat for transfer to the liquid fuel storage when additional heat is needed to provide a required flow rate of fuel vapor to the electricity-generating assembly. In implementation, the heat transfer system may include adjustable valves for selectively controlling in the operational mode an amount of generating assembly waste heat being combined with the data center waste heat for transfer to the liquid fuel storage to vaporize the liquid fuel, with the controller automatically controlling the adjustable valves to provide the required flow rate of fuel vapor to the electricity-generating assembly. In the operational mode, the data center waste heat may be transferred from at least one data center heat exchanger to at least one fuel storage heat exchanger via a heat transfer fluid flow through at least one fluid loop of the heat transfer system coupling in fluid communication the at least one data center heat exchanger and the at least one fuel storage heat exchanger, such as through at least one facility fluid loop. Similarly, the generating assembly waste heat may be transferred from at least one generating assembly heat exchanger to the at least one fuel storage heat exchanger via, in part, a heat transfer fluid flow through the at least one fluid loop of the heat transfer system.

In one or more embodiments, the system may include a vaporizer associated with the liquid fuel storage, with the vaporizer being, in one example, a direct-fired vaporizer. In such embodiments, in a start-up mode, the system may combine fuel vapor output of the vaporizer with fuel vapor output of the liquid fuel storage, produced from the transfer of the data center waste heat to the liquid fuel storage. A controller may be provided, configured to automatically control the output of fuel vapor from the vaporizer, that is, to control the amount of fuel vaporization within the vaporizer, with reference to the output of the fuel vapor from the liquid fuel storage, to automatically provide a required flow rate of the fuel vapor to the electricity-generating assembly. Initially in start-up mode, representative, for instance, of data center start-up, the vaporizer may vaporize a greater percentage of the liquid fuel than occurring within the liquid fuel storage, but as time progresses, the liquid fuel storage outputs more of the fuel vapor required for delivery to the electricity-generating assembly.

In one or more start-up mode implementations, the electricity-generating assembly produces generating assembly waste heat, and the controller selectively combines the generating assembly waste heat with the data center waste heat for transfer to the liquid fuel storage when additional heat is needed to provide the required flow rate of the fuel vapor to the electricity-generating assembly from the liquid fuel storage without the output of fuel vapor from the vaporizer. The controller may be programmed to automatically turn off the vaporizer when the output of the liquid fuel storage is at the required fuel vapor flow rate for the electricity-generating assembly.

In certain implementations, the operational mode is a back-up operational mode, the heat transfer system comprises a controller, the liquid fuel storage comprises a back-up liquid fuel storage, and the fuel vapor comprises the back-up fuel vapor. In these implementations, based on an interruption in a primary fuel vapor supply to the electricity-generating assembly, the controller may automatically initiate the back-up operational mode, and control the heat transfer system to the direct data center waste heat to the back-up liquid fuel storage to generate the back-up fuel vapor for supply to the electricity-generating assembly for continued operation of the electricity-generating assembly. Further, the electricity-generating assembly may produce generating assembly waste heat, and the system may include an absorption chiller receiving the generating assembly waste heat. The absorption chiller may operate to dissipate the data center waste heat in a normal operational mode, when the primary fuel vapor supply is provided to the electricity-generating assembly, with the controller automatically switching the data center waste heat away from the absorption chiller and to the back-up liquid fuel storage in the back-up operational mode, facilitating both vaporization of back-up liquid fuel in the back-up liquid fuel storage, and dissipation of the data center waste heat.

Figure 2A:
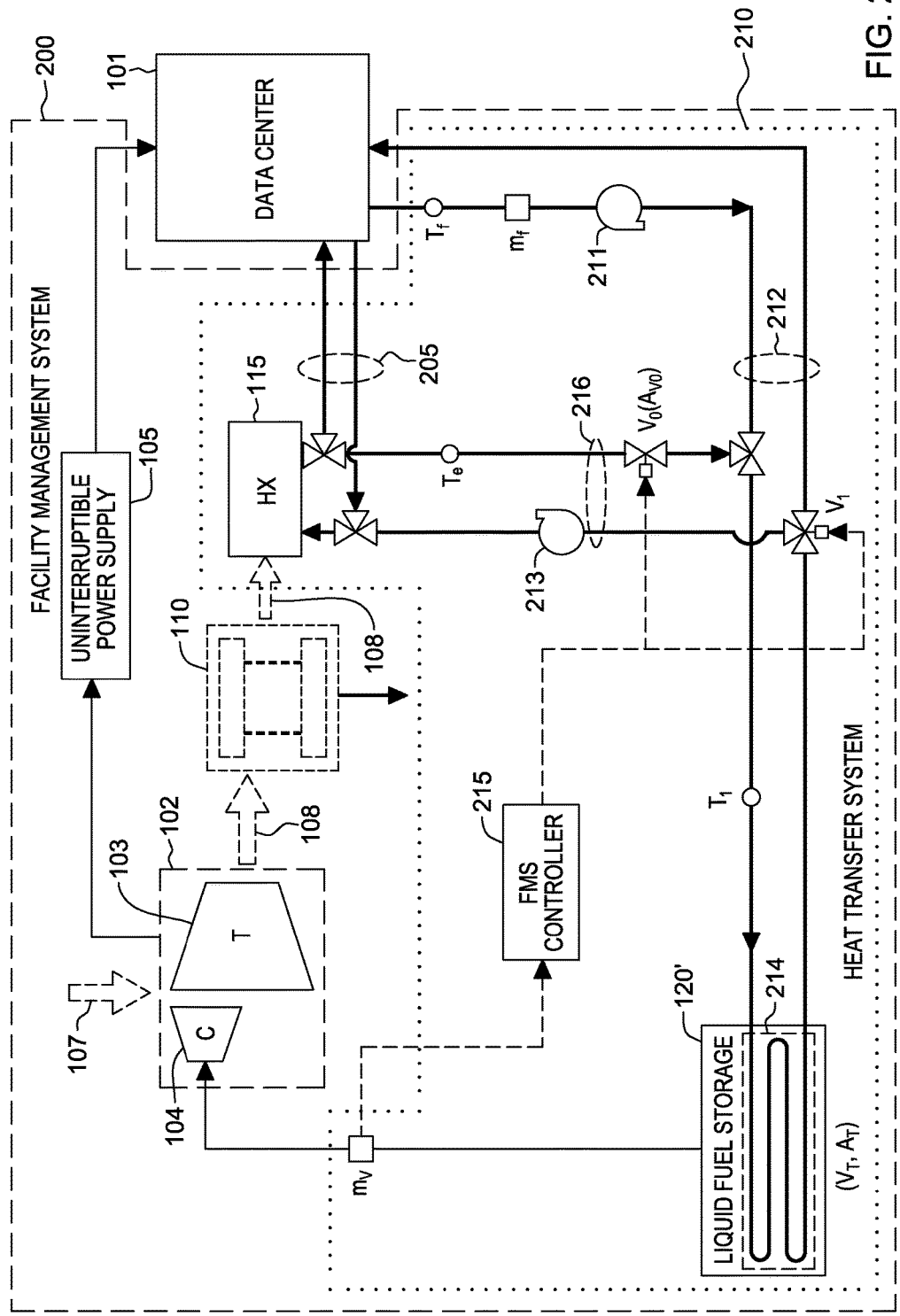
FIG. 2A depicts one embodiment of a system for electricity generation, fuel vaporization and data center cooling, in accordance with one or more aspects of the present invention.
Figure 2B:
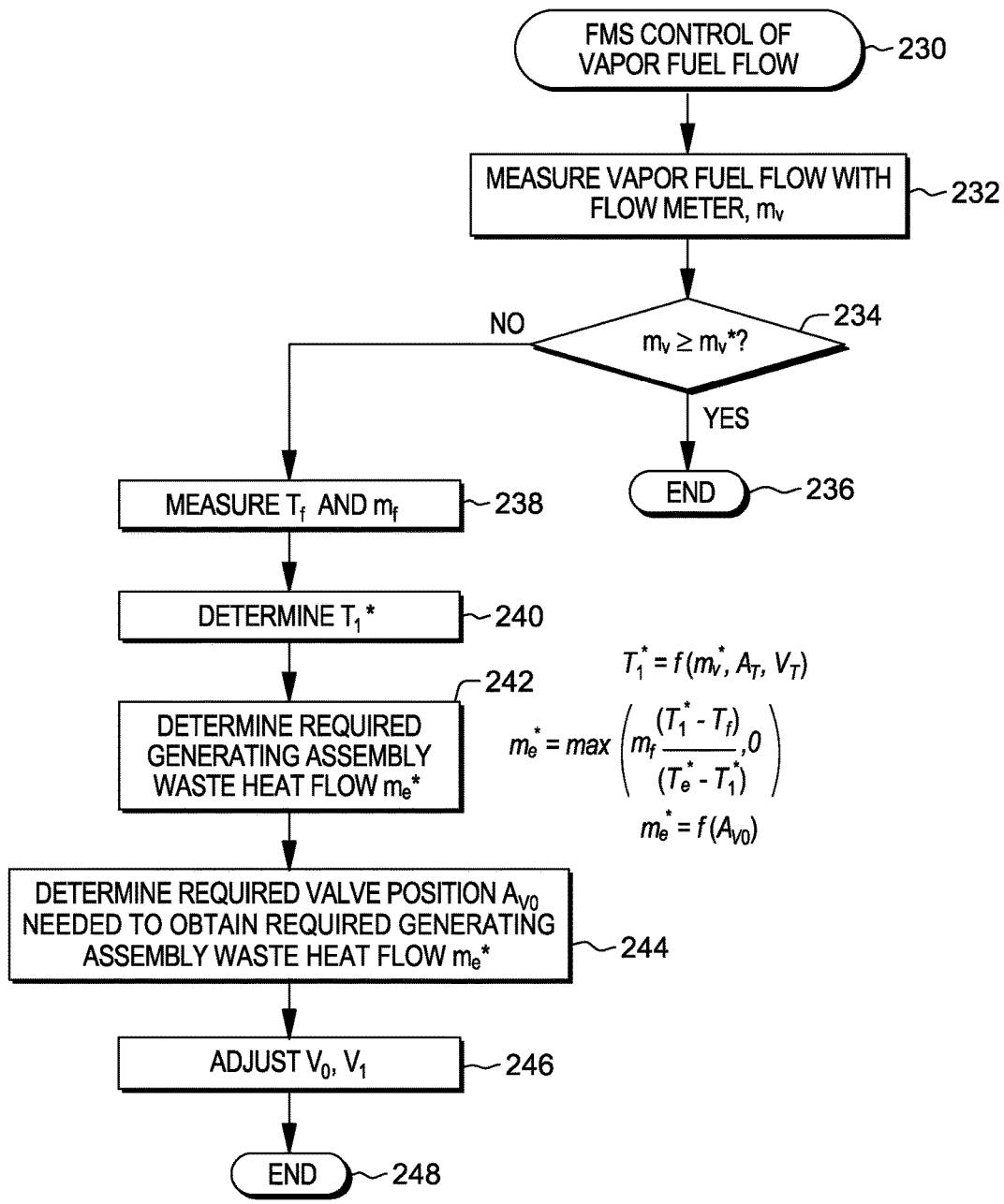
FIG. 2B depicts one embodiment of a normal mode control process for the system of FIG. 2A, implemented for instance, by a facility management system (FMS) controller, in accordance with one or more aspects of the present invention.

FIGS. 2A & 2B depict one embodiment of a system, in accordance with one or more aspects of the present invention. These figures represent an exemplary system, where the liquid fuel storage provides the required flow rate of fuel vapor to the electricity-generating system.

Referring to FIG. 2A, the system comprises (in one example) a facility management system 200 which includes electricity-generating assembly 102, which as noted, may generate on-site power for data center 101 to meet or assist with electrical requirements of the data center. The electricity-generating assembly 102 may comprise a variety of prime movers, such as a micro-turbine, a turbine, a gas generator, a fuel cell, etc. As one example, electricity-generating assembly 102 includes turbine 103 and optionally, compressor 104, which in the depicted example, are coupled to directly receive fuel vapor from liquid fuel storage 120', as described herein. In the illustrated embodiment, electricity is supplied via uninterruptible power supply 105 to data center 101. In operation, an airflow 107 may be drawn into electricity-generating assembly 102, and heated during the electricity-generating process to produce an exhaust airflow comprising generating assembly waste heat 108. An absorption chiller 110 may optionally be provided to facilitate cooling the data center or an associated facility, if desired.

In the system of FIG. 2A, a heat transfer system 210 is provided, which includes heat exchanger 115, such as an exhaust-fired heat exchanger, which may be used to transfer generating assembly waste heat to a heat transfer fluid for use as described below. If desired, a portion of the heat transfer fluid may be provided via a hot fluid loop 205 to data center 101, for instance, to provide hot water to the data center or nearby facilities.

In FIG. 2A, heat transfer system 210 includes a first heat transfer fluid loop 212, with one or more fluid pumps 211. Heat transfer loop 212 couples in fluid communication one or more data center heat exchangers of, for instance, one or more of the heat extraction approaches described above in connection with FIGS. 1B & 1C, and one or more fuel storage heat exchangers 214 associated with liquid fuel storage 120'. In one example, the one or more fuel storage heat exchangers 214 could be disposed within a liquid fuel storage tank of liquid fuel storage 120'. Alternatively, fuel storage heat exchanger(s) 214 could be disposed external to the liquid fuel storage 120', but coupled to the storage and liquid fuel within the storage. In an operational mode, heat transfer system 210 transfers data center waste heat to liquid fuel storage 120' to facilitate vaporization of liquid fuel within the liquid fuel storage to produce fuel vapor for supply to the electricity-generating assembly 102, as illustrated. Advantageously, the use of data center waste heat to vaporize liquid fuel reduces, or even eliminates, the cooling requirement on the absorption chiller, while also reducing the cost for providing on-site fuel vapor from a liquid fuel storage.

If data center waste heat provided via first heat transfer fluid loop 212 is insufficient to vaporize the desired amount of liquid fuel to achieve a required liquid fuel flow rate, then the heat transfer system 210, and in the depicted example, a facility management system (FMS) controller 215 thereof, may automatically control valves $V_0$ and $V_1$ linking a second heat transfer fluid loop 216 (with one or more fluid pumps 213) to first heat transfer fluid loop 212, to transfer additional heat into the fuel storage heat exchanger(s) 214, with the additional heat being extracted by heat exchanger 115 from the generating assembly waste heat 108. The amount of supplemental heat provided by controller 215 will be a function of the requirements of the electricity-generating assembly 102. The system of FIG. 2A illustrates a controllable mixing valve(s) approach to combining the heat transfer fluid flows in the first and second heat transfer fluid loops 212, 216. In one embodiment, the mixing valve(s) may be modulated based on a differential pressure reading of the fuel vapor being provided to the electricity-generating assembly 102. As more vapor is required, valves $V_0$, $V_1$ may be, for instance, automatically controlled to allow more electricity-generating waste heat to be transferred to fuel storage heat exchanger(s) 214. Additionally, FMS controller 215 could be configured to automatically control operation of fluid pumps 211, 213, as desired for a particular fluid flow rate through the heat transfer system.

Note that in one or more embodiments, the data center return line of the first heat transfer fluid loop 212 may be plumbed directly to the data center, that is, where enough heat has been removed to satisfy the cooling requirements of data center 101. Alternatively, the heat transfer fluid return line could be directed to absorption chiller 110 to provide additional cooling, where required.

FIG. 2B depicts one embodiment of a normal mode control process for the system of FIG. 2A, implemented, for instance, by FMS controller 215 of FIG. 2A.

Referring to FIG. 2B, in one embodiment, control of vapor fuel flow 230 may include measuring the vapor fluid flow rate (mv) with a flow meter 232, and determining whether the measured flow rate of fuel vapor is greater than or equal to a required flow rate of fuel vapor ($m_v^*$) 234. If "yes", then this iteration of the control process is complete 236. If "no", however, temperature ($T_f$) and flow rate ($m_f$) 238 of the heat transfer fluid transporting data center waste heat are measured. For instance, the temperature and flow rate of heat transfer fluid within first heat transfer fluid loop 212 (FIG. 2A) are obtained. From this information, a required heat transfer fluid temperature ($T_1^*$) may be determined 240, which will be needed at a temperature sensor ($T_1$) at the input to the one or more fuel vapor storage heat exchangers 214 (FIG. 2A) to vaporize a needed amount of liquid fuel to achieve the required flow rate of fuel vapor ($m_v^*$) to the electricity-generating assembly.

In one embodiment, the required fluid temperature ($T_1^*$) may be determined by one skilled in the art as a function of the required flow rate for the fuel vapor ($m_v^*$), a characteristic wetted surface area ($A_T$) of the liquid fuel storage tank, and a fill volume ($V_T$) of the liquid fuel within the liquid fuel storage tank. Processing then determines a required generating assembly waste heat flow rate ($m_e^*$) 242 to be obtained from the second heat transfer fluid loop 216 (FIG. 2A) as supplemental heat. The following equations may be used to estimate the valve $V_0$ (FIG. 2A) position ($A_{V0}$) needed to provide the required flow rate of fuel vapor to the electricity-generating assembly, where $T_e^*$ is a required heat transfer fluid temperature at the output of heat exchanger 115 (FIG. 2A):

$$m_3^* = \max\left(m_f \frac{(T_1^* - T_f)}{(T_e^* - T_1^*)}, 0\right)$$

$$m_3^* = f(A_{V0})$$

Processing determines the required valve position ($A_{V0}$) 244 for adjustable valve $V_0$ in second heat transfer fluid loop 216 of FIG. 2A. The required valve position is that valve position needed to obtain the desired generating assembly waste heat flow ($m_e^*$), for mixing with the heat transfer fluid flow in the first heat transfer fluid loop transporting the data center waste heat, to achieve the desired heat transfer fluid temperature ($T_1^*$) at the input to the fuel storage heat exchanger(s). Once determined, the FMS controller 215 automatically adjusts valves $V_0$ and $V_1$ 246 to achieve the desired mixing of generating assembly waste heat and data center waste heat for transfer to the liquid fuel storage for vaporizing the needed amount of liquid fuel, which completes this iteration of the control process 248. Note that, in an alternative approach, valves $V_0$, $V_1$ could be adjusted using a feedback control loop, for example, a proportional integral control process, which may stepwise adjust the mixing of the generating assembly waste heat and data center waste heat for forwarding to the liquid fuel storage.

Advantageously, use of data center waste heat, either alone or in combination with generating assembly waste heat, to vaporize fuel within the liquid fuel storage, may remove the need for an absorption chiller in the system of FIG. 2A. Also, although heat exchanger 115 (FIG. 2A) is shown external to electricity-generating assembly 102, the heat exchanger could be incorporated within electricity-generating assembly 102. For instance, turbines with internal heat exchangers are available in the art, such as those available from Elliott® Microturbines, of Jeannette, Pa., USA.

Figure 3A:
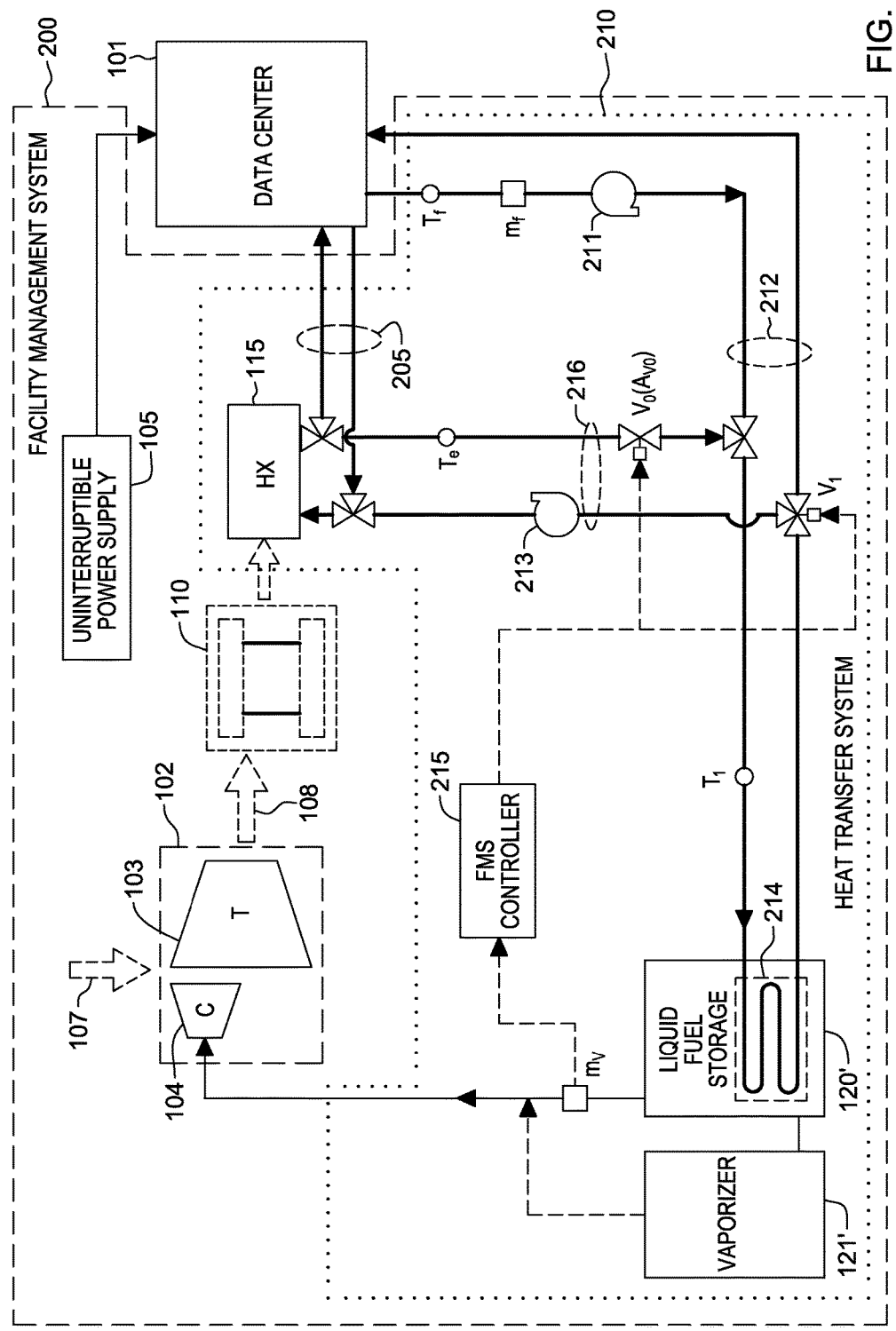
FIG. 3A depicts the system of FIG. 2A, with a system start-up mode enhancement, in accordance with one or more aspects of the present invention.
Figure 3B:
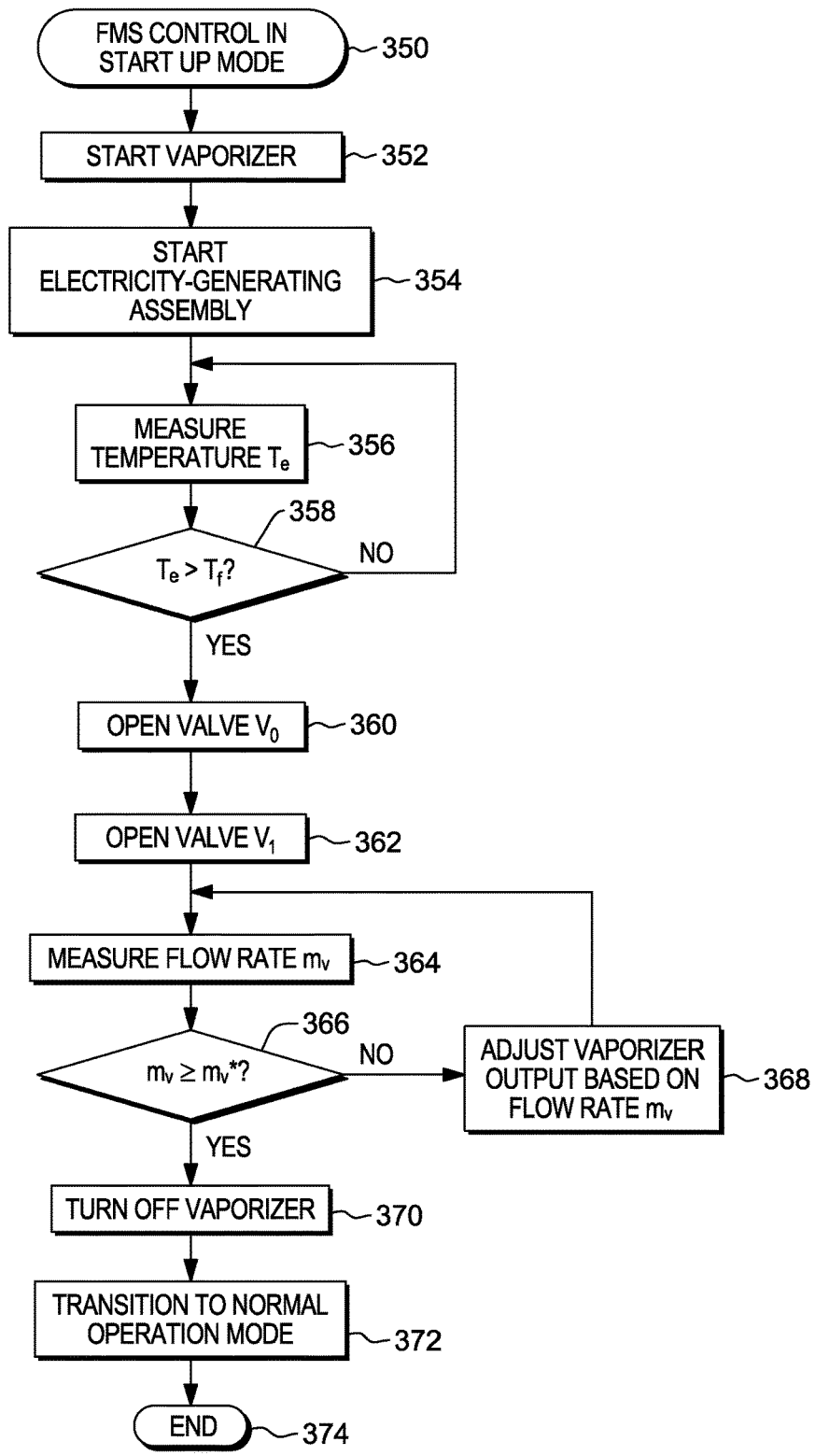
FIG. 3B depicts one embodiment of a start-up mode control process for the system of FIG. 3A implemented, for instance, by the facility management system controller, and facilitating automated control of fuel vaporization in system start-up mode, in accordance with one or more aspects of the present invention.

FIGS. 3A & 3B depict an enhancement on the system embodiment of FIGS. 2A & 2B, in accordance with one or more aspects of the present invention. These figures represent an exemplary system in a start-up mode. In this mode, electricity-generating assembly 102 is inactive, generating no electricity or waste heat, and no waste heat is being generated by data center 101. Therefore, to provide the required fuel vapor to the electricity-generating assembly for start-up, a vaporizer 121' is added in fluid communication with liquid fuel storage 120'. Vaporizer 121' may be, for instance, a direct-fired vaporizer which uses, for instance, a pilot light to begin vaporization. As the data center and generating assembly produce waste heat, the system's reliance on vaporizer 121' may be reduced, and ultimately eliminated at full operation, for instance, in a normal operation mode such as described above in connection with FIGS. 2A & 2B. Note that in an alternative scenario, start-up mode may refer to start-up of the electricity-generating assembly, but in a scenario where the data center is already up and running using an alternative power system, such as the above-noted uninterruptible power supply 105, and only the electricity-generating system needs to be brought on-line. In this case, the data center waste heat from the operational data center could be used to provide the heat necessary to vaporize the required amount of fuel vapor from the liquid fuel storage, or to supplement the fuel vapor provided by vaporizer 121'.

FIG. 3B depicts one embodiment of a start-up control process for the system of FIG. 3A. As illustrated, in one embodiment, start-up mode control 350 may include starting the vaporizer 352, such as vaporizer 121' of FIG. 3A, and once the required flow rate of fuel vapor is provided, starting the electricity-generating assembly 354. Temperature of heat transfer fluid ($T_e$) transporting the generating assembly waste heat is measured 356, that is, the temperature of the heat transfer fluid within the second heat transfer fluid loop 216 (FIG. 3A) coupling in fluid communication the one or more heat exchangers 115 and the first heat transfer fluid loop 212. The measured temperature ($T_e$) is then compared against the temperature of the heat transfer fluid ($T_f$) transporting the data center waste heat 358. Assuming that temperature ($T_e$) is less than temperature ($T_f$), meaning that the temperature of the fluid transporting the generating assembly waste heat is less than the temperature of the fluid transporting the data center waste heat, processing may, for instance, wait a defined time interval before again measuring temperature ($T_e$). Once temperature ($T_e$) exceeds temperature ($T_f$), then valve $V_0$ coupling the second heat transfer fluid loop to the first heat transfer fluid loop is opened fully 360, as well as valve $V_1$ 362, to combined the generating assembly waste heat with the data center waste heat for provision to the one or more fuel storage heat exchangers of the liquid fuel storage.

The controller measures flow rate ($m_v$) of fuel vapor output from the liquid fuel storage 364, and determines whether this flow rate ($m_v$) is at or above the required flow rate ($m_v$*) of fuel vapor to the electricity-generating assembly 366. If "no", then the vaporizer output is incrementally adjusted, with reference to the measured flow rate (my) being output by the liquid fuel storage 368, and after a desired time interval, the flow rate measuring, comparing and adjusting steps 364, 366, 368 may be repeated. Once the flow rate ($m_v$) of fuel vapor output from the liquid fuel storage exceeds the required flow rate, the vaporizer can be turned off 370, and system operation may be transitioned to normal operation mode 372, such as the mode described above in connection with FIGS. 2A & 2B, which completes the start-up mode control 374. Note that with the above-described process, the vaporizer may initially provide substantially all of the fuel vapor required to meet the specified flow rate of fuel vapor to the electricity-generating assembly, and as the electricity-generating assembly and the data center generate waste heat, more fuel will be vaporized in the liquid fuel storage, meaning that the vaporizer load can be reduced, and when sufficient fuel is being vaporized in the liquid fuel storage, the vaporizer may be shut off, and control may transition to a normal operation mode, as described above.

Figure 4A:
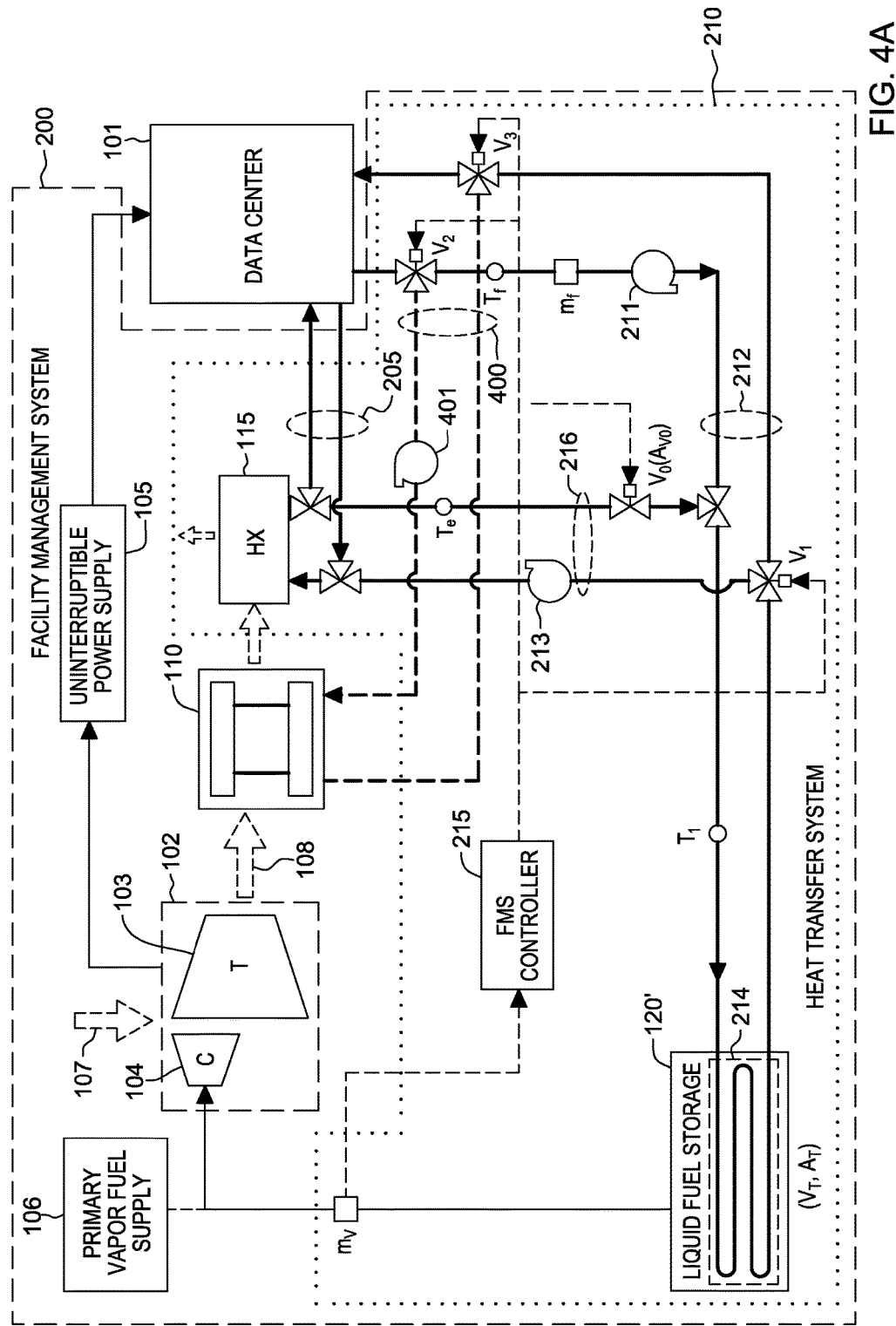
FIG. 4A depicts one embodiment of a system for electricity generation, fuel vaporization and data center cooling, having a normal operational mode, and in a back-up operational mode, in accordance with one or more aspects of the present invention.
Figure 4B:
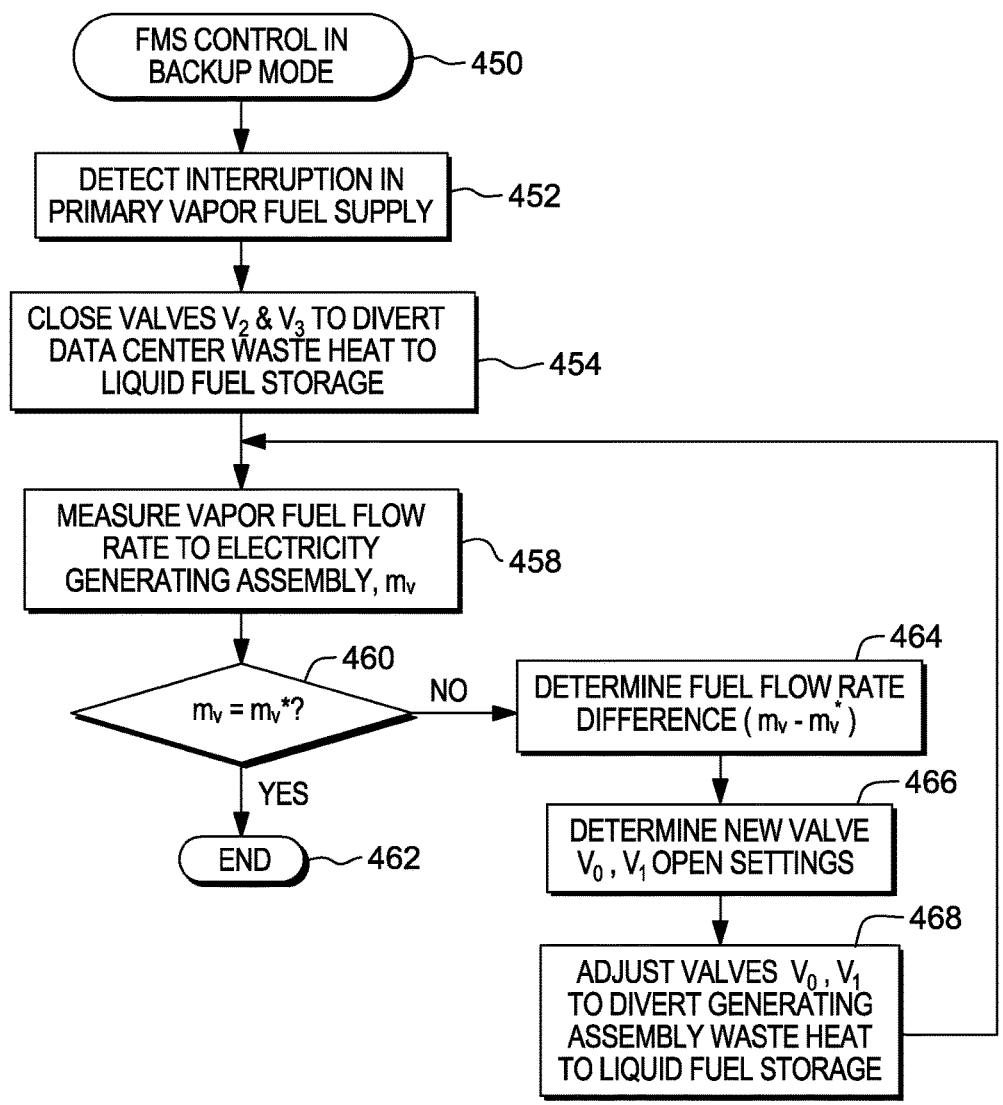
FIG. 4B depicts one embodiment of a back-up mode control process for the system of FIG. 4A implemented, for instance, by the facility management system controller to control system transition to a back-up vapor fuel source, which uses data center waste heat for continued power generation, in accordance with one or more aspects of the present invention.

FIGS. 4A & 4B depict an enhanced variation on the systems described above in connection with FIGS. 2A-3B, in accordance with one or more aspects of the present invention. These figures represent an exemplary system where the liquid fuel storage and heat transfer system are utilized in a back-up operational mode.

Referring to FIG. 4A, the system comprises (in one example) the above-described facility management system 200 and heat transfer system 210, wherein electricity-generating assembly 102 is coupled to primarily receive fuel vapor from a primary vapor fuel supply 106. Should this fuel supply be interrupted, for instance, due to an emergency, then operation of on-site electricity-generating assembly 102, and data center 101, may be continued by switching the system to a back-up fuel vapor provided by back-up liquid fuel storage 120'. At the time of transition, data center electricity may be provided by uninterruptible power supply 105 until a sufficient flow rate of back-up fuel vapor is provided from liquid fuel storage 120' to electricity-generating assembly 102. Note that in the exemplary system of FIG. 4A, prior to discontinuance of the primary vapor fuel supply 106 to electricity-generating assembly 102, cooling to data center 101 may be provided by absorption chiller 110 via chilled facility coolant pumped 401 through one or more facility coolant loops 400 coupled via valves $V_2$, $V_3$ to data center 101. Upon interruption in primary vapor fuel supply 106, the absorption chiller 110, and data center cooling, may cease operation, allowing data center temperature, and in particular, data center waste heat temperature, to begin to rise. The higher temperature data center waste heat can be used to more quickly vaporize the back-up liquid fuel in back-up liquid fuel storage 120' to provide the required flow rate of fuel vapor to the electricity-generating assembly. This dissipation of data center waste heat at the liquid fuel storage advantageously also provides cooling to the data center.

FIG. 4B depicts one embodiment of a back-up control process for the system of FIG. 4A implemented, for instance, by FMS controller 215 of FIG. 4A.

Referring to FIG. 4B, in one embodiment, back-up control mode 450 is entered upon detection of interruption in primary vapor fuel supply 452. The controller closes valves $V_2$, $V_3$ to divert data center waste heat from the absorption chiller to the liquid fuel storage 454. Processing measures the back-up vapor fuel flow rate ($m_v$) from the liquid fuel storage to the electricity-generating assembly 458, and determines whether this flow rate ($m_v$) is at or above the required flow rate ($m_v$*) for operation of the electricity-generating assembly 460. If "yes", then the controller has successfully transitioned to back-up mode operation 462. If "no", then (in one embodiment) processing determines the fuel flow rate difference between the measured flow rate of fuel vapor ($m_v$) and the required flow rate of fuel vapor ($m_v$*) 464, and from this, determines new valve open settings for valves $V_0$, $V_1$ 466, and adjusts the valves $V_0$, $V_1$ accordingly 468 to, for instance, increase liquid fuel vaporization within the liquid fuel storage to attain the desired flow rate.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention.

What is claimed is:

1. A method comprising:
   providing an electricity-generating assembly to generate electricity from a fuel vapor for supply to a data center, the data center producing data center waste heat;
   providing a liquid fuel storage to facilitate supply of the fuel vapor to the electricity-generating assembly;
   providing a heat transfer system associated with the data center and the liquid fuel storage, wherein in an operational mode, the heat transfer system transfers the data center waste heat to the liquid fuel storage to facilitate vaporization of liquid fuel to produce the fuel vapor for supply to the electricity-generating assembly; and
   wherein the heat transfer system comprises a controller, and the electricity-generating assembly produces generating assembly waste heat, the controller controllably combining in the operational mode the generating assembly waste heat with the data center waste heat for transfer to the liquid fuel storage when additional heat is required to provide a required flow rate of the fuel vapor to the electricity-generating assembly.

2. The method of claim 1, wherein the heat transfer system further comprises adjustable valves for selectively controlling in the operational mode an amount of the generating assembly waste heat combined with the data center waste heat for transfer to the liquid fuel storage to vaporize the liquid fuel, the controller automatically controlling the adjustable valves to provide the required flow rate of the fuel vapor to the electricity-generating assembly.

3. The method of claim 1, wherein in the operational mode, the data center waste heat is transferred from at least one data center heat exchanger to at least one fuel storage heat exchanger via a heat transfer fluid flow through at least one fluid loop of the heat transfer system coupling in fluid communication the at least one data center heat exchanger and the at least one fuel storage heat exchanger.

4. The method of claim 1, further comprising providing a vaporizer associated with the liquid fuel storage, and wherein the heat transfer system combines fuel vapor output of the vaporizer with fuel vapor output of the liquid fuel storage, due to the transfer of the data center waste heat to the liquid fuel storage, and the controller is configured to automatically control output of fuel vapor from the vaporizer, with reference to output of the fuel vapor from the liquid fuel storage, the controller automatically adjusting the output of the fuel vapor from the vaporizer to provide a required flow rate of the fuel vapor to the electricity-generating assembly.

5. The method of claim 4, wherein the controller selectively combines the generating assembly waste heat with the data center waste heat for transfer to the liquid fuel storage when additional heat is needed to provide the required flow rate of the fuel vapor to the electricity-generating assembly from the liquid fuel storage without the output of fuel vapor from the vaporizer.

6. The method of claim 5, wherein the controller automatically turns off the vaporizer when the fuel vapor output of the liquid fuel storage is at the required flow rate of the fuel vapor for the electricity-generating assembly.

7. The method of claim 1, wherein the operational mode comprises a back-up operational mode, the liquid fuel storage comprises a back-up liquid fuel storage, and the fuel vapor comprises a back-up fuel vapor, and wherein, based on an interruption in a primary fuel vapor supply to the electricity-generating assembly, the controller automatically initiates the back-up operational mode and controls the heat transfer system to direct the data center waste heat to the back-up liquid fuel storage to generate the back-up fuel vapor for supply to the electricity-generating assembly for continued operation of the electricity-generating assembly.

8. The method of claim 7, wherein the method further comprises providing an absorption chiller receiving the generating assembly waste heat, the absorption chiller operating to dissipate the data center waste heat in a normal operational mode when the primary fuel vapor supply is provided to the electricity-generating assembly, and the controller automatically switching the data center waste heat away from the absorption chiller and to the back-up liquid fuel storage in the back-up operational mode.

9. A method comprising:
   providing a heat transfer system coupling a data center and a liquid fuel storage, the data center producing data center waste heat, and the liquid fuel storage being coupled to facilitate supply of a fuel vapor to an electricity-generating assembly, the electricity-generating assembly generating electricity from the fuel vapor for supply to the data center, wherein in an operational mode, the heat transfer system transfers the data center waste heat to the liquid fuel storage to facilitate vaporization of liquid fuel to produce the fuel vapor for supply to the electricity-generating assembly; and
   wherein the heat transfer system comprises a controller, and the electricity-generating assembly produces generating assembly waste heat, the controller controllably combining in the operational mode the generating assembly waste heat with the data center waste heat for transfer to the liquid fuel storage when additional heat is required to provide a required flow rate of the fuel vapor to the electricity-generating assembly.

* * * * *